United States Patent
Tunks et al.

(10) Patent No.: US 11,706,900 B1
(45) Date of Patent: Jul. 18, 2023

(54) PASSIVE AND ACTIVE ENVIRONMENTAL MANAGEMENT OF AN INFORMATION HANDLING SYSTEM

(71) Applicant: Dell Products L.P., Round Rock, TX (US)

(72) Inventors: Eric Michael Tunks, Austin, TX (US); Ayedin Nikazm, Austin, TX (US); Joseph Andrew Vivio, Seattle, WA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/576,721

(22) Filed: Jan. 14, 2022

(51) Int. Cl.
*H05K 7/20* (2006.01)
*H05K 5/02* (2006.01)

(52) U.S. Cl.
CPC ......... *H05K 7/20209* (2013.01); *H05K 5/023* (2013.01); *H05K 5/0213* (2013.01); *H05K 7/20136* (2013.01)

(58) Field of Classification Search
CPC .. H05K 7/20209; H05K 5/0213; H05K 5/023; H05K 7/20136
See application file for complete search history.

(56) References Cited

U.S. PATENT DOCUMENTS

| | | | |
|---|---|---|---|
| 10,264,715 B1* | 4/2019 | Ortega Gutierrez | H05K 7/20745 |
| 10,624,241 B1* | 4/2020 | Ross | H05K 7/20736 |
| 10,667,435 B1* | 5/2020 | Alissa | H05K 7/20836 |
| 2006/0168975 A1* | 8/2006 | Malone | H05K 7/20836 236/49.3 |
| 2007/0110255 A1* | 5/2007 | Barath | G10K 11/17835 381/71.5 |
| 2015/0116929 A1* | 4/2015 | Shabbir | H05K 7/20836 361/679.48 |
| 2015/0156917 A1* | 6/2015 | Ogawa | H05K 7/20136 361/695 |
| 2017/0269653 A1* | 9/2017 | Shabbir | H05K 7/20727 |
| 2019/0327860 A1* | 10/2019 | Edwards | H05K 7/20772 |
| 2019/0371367 A1* | 12/2019 | Asmussen | G11B 5/40 |
| 2020/0116690 A1* | 4/2020 | Alissa | H05K 7/1427 |
| 2020/0367387 A1* | 11/2020 | Selvidge | H05K 7/20772 |
| 2021/0307210 A1* | 9/2021 | Wong | H05K 7/20327 |
| 2022/0052474 A1* | 2/2022 | Chiu | G02B 6/4261 |

* cited by examiner

*Primary Examiner* — Michael A Matey
(74) *Attorney, Agent, or Firm* — Chamberlain, Hrdlicka, White, Williams & Aughtry (57) ABSTRACT

An information handling system includes a plurality of computing devices, and at least one environmental management unit external to the plurality of computing devices and configured to manage an internal environment of the information handling system.

18 Claims, 9 Drawing Sheets

PASSIVE AND ACTIVE ENVIRONMENTAL MANAGEMENT OF AN INFORMATION HANDLING SYSTEM

BACKGROUND

Information handling systems include a plurality of computing devices. The computing devices may perform services. In order to provide the services, the computing devices may include hardware components and software components. The software components may utilize the hardware components to provide the services.

SUMMARY

In general, in one aspect, the invention relates to an information handling system. The information handling system includes a plurality of computing devices, and at least one environmental management unit external to the plurality of the computing devices and configured to manage an internal environment of the information handling system.

In general, in one aspect, the invention relates to a method for heating an internal environment of an information handling system. The method for heating the internal environment of the information handling system may include determining an environmental condition of a plurality of computing devices in the information handling system; in response to determination, initiating heating of cold air circulating within the internal environment of the information handling system using an environmental management unit, wherein the environmental management unit is located within the information handling system and is external to the plurality of computing devices. The information handling system further comprises a passive component and the passive component is configured to manage the internal environment of the information handling system.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 3.1 shows a side-view of an insulator component in accordance with one or more embodiments of the invention.

FIG. 3.2 shows a side-view of a nested insulator component in accordance with one or more embodiments of the invention.

FIG. 3.3 shows a side-view of a nested insulator component in accordance with one or more embodiments of the invention.

FIG. 3.4 shows a side-view of an information handling system in accordance with one or more embodiments of the invention.

FIG. 4.1 shows a diagram of a heater component in accordance with one or more embodiments of the invention.

FIG. 4.2 shows a side-view of an information handling system in accordance with one or more embodiments of the invention.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information and/or power may travel may be considered an operative connection.

Information handling systems include a plurality of computing devices. A computing device may include any number of hardware components that facilitate providing the services of the computing device. The hardware components may include, for example, processors, non-persistent storage drives, persistent storage drives, circuit cards that interconnect these components, etc. In some cases, the information handling systems might be deployed in environments that result in the temperature of computing devices being outside of their designed operating range. For example, the computing devices may be designed to operate at temperatures above 0° C. When the information handling systems are deployed to harsh environmental conditions (e.g., −40° C.-60° C.), the computing devices may not operate properly and, in certain scenarios, may be damaged.

To address one or more of the aforementioned issues, embodiments of the invention provide a passive and active environmental management of an internal environment of the information handling system, e.g., such that the internal environment of the information handling system is within the designed operating range of the computing devices. More specifically, embodiments of the invention include at least one environmental management unit external to the plurality of the computing devices and configured to manage the internal environment of the information handling system.

Various embodiments of the computing device are described below.

Figure 1:
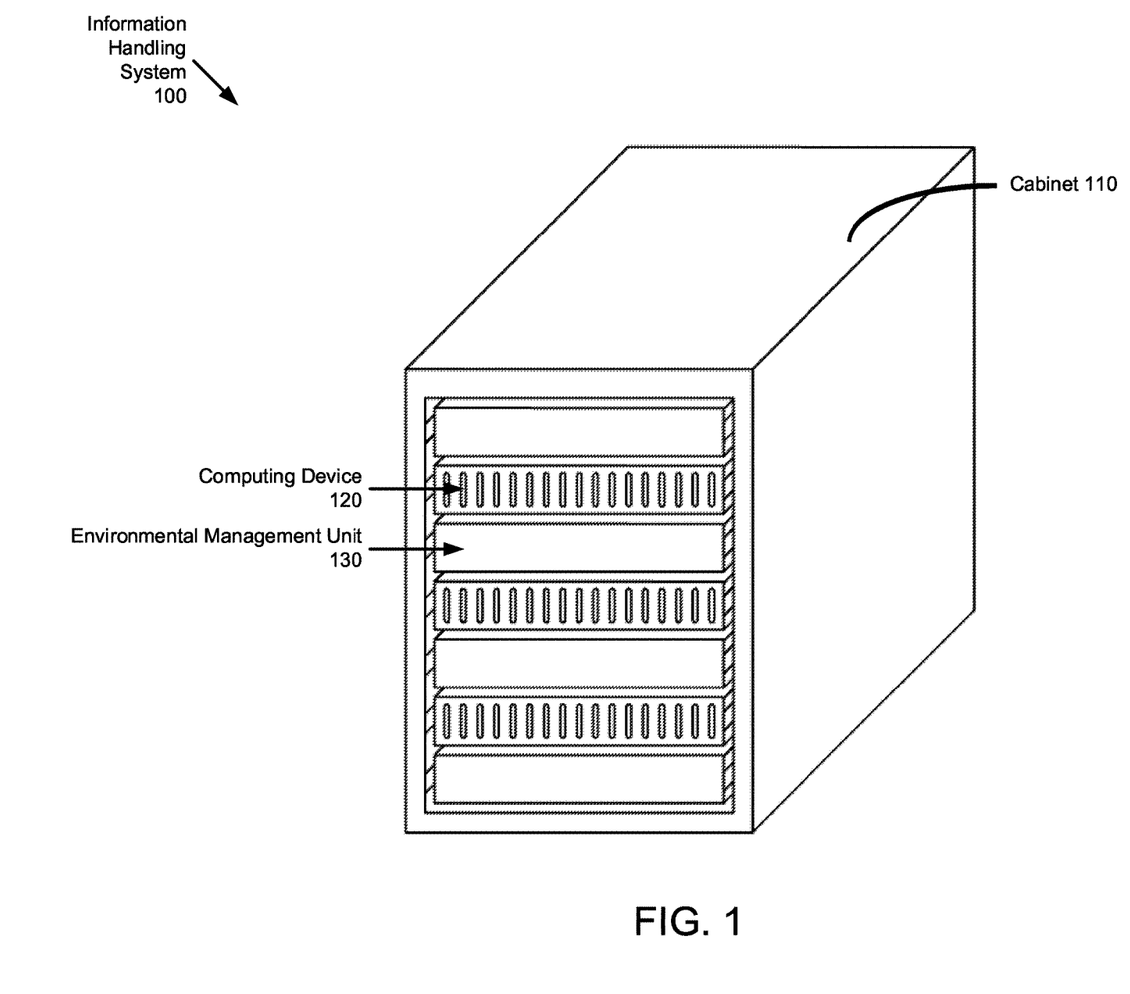
FIG. 1 shows a diagram of an information handling system in accordance with one or more embodiments of the invention.

FIG. 1 shows a diagram of an information handling system (100) in accordance with one or more embodiments of the invention. The system may include a cabinet (110), any number of computing devices (e.g., 120), and any number of environmental management units (e.g., 130) disposed within the cabinet. In one embodiment of the invention, the internal volume of the cabinet may be referred to as the internal environment of the information handling system.

The cabinet (110) may be a mechanical structure that enables computing devices (e.g., 120) and environmental management units (e.g., 130) to be positioned with respect to one another. For example, the cabinet (110) may be a rack mountable enclosure that enables the computing devices (e.g., 120) and the environmental management units (e.g., 130) to be disposed within it. The cabinet (110) may be implemented as other types of structures adapted to house, position, orient, and/or otherwise physically, mechanically, electrically, and/or thermally manage the computing devices (e.g., 120) and the environmental management units (e.g., 130). By managing the computing devices (e.g., 120) and the environmental management units (e.g., 130), the cabinet (110) may enable multiple computing devices and environmental management units to be densely packed in a space without negatively impacting the operation of the information handling system (100).

A computing device (e.g., 120) may be a mechanical structure for housing components of the information handling system (100). For example, the computing device (e.g., 120) may be implemented as a rack mountable enclosure for housing components of the information handling system. The computing device (e.g., 120) may be adapted to be disposed within the cabinet (110) and/or utilize services provided by the cabinet (110) and/or other devices.

To provide services, the computing device (e.g., 120) may utilize computing device resources provided by hardware components. The hardware components may include, for example, processors, non-persistent storage drives, a printed circuited board(s), persistent storage drives, special purpose hardware, and/or other types of physical components that contribute to the operation of the computing device.

Continuing the discussion of FIG. 1, an environmental management unit (e.g., 130) may be a mechanical structure for housing components of the information handling system (100). For example, the environmental management unit (e.g., 130) may be implemented as a rack mountable enclosure for housing components of the information handling system. The environmental management unit (e.g., 130) may be adapted to be disposed within the cabinet (110) and/or utilize services provided by the cabinet (110) and/or other devices, while having the same form factor as at least one of the computing devices (e.g., 120).

To provide services, the environmental management unit (e.g., 130) may utilize environmental management unit resources provided by hardware components. The hardware components may include, for example, thermally insulating components, soft components, rigid components, outer components, heater control components, environmental control components, temperature control components, and/or other types of physical components that contribute to the operation of the environmental management unit. Additional detail about various embodiments of the environmental management units are described below in FIGS. 3.1-5.

Figure 2:
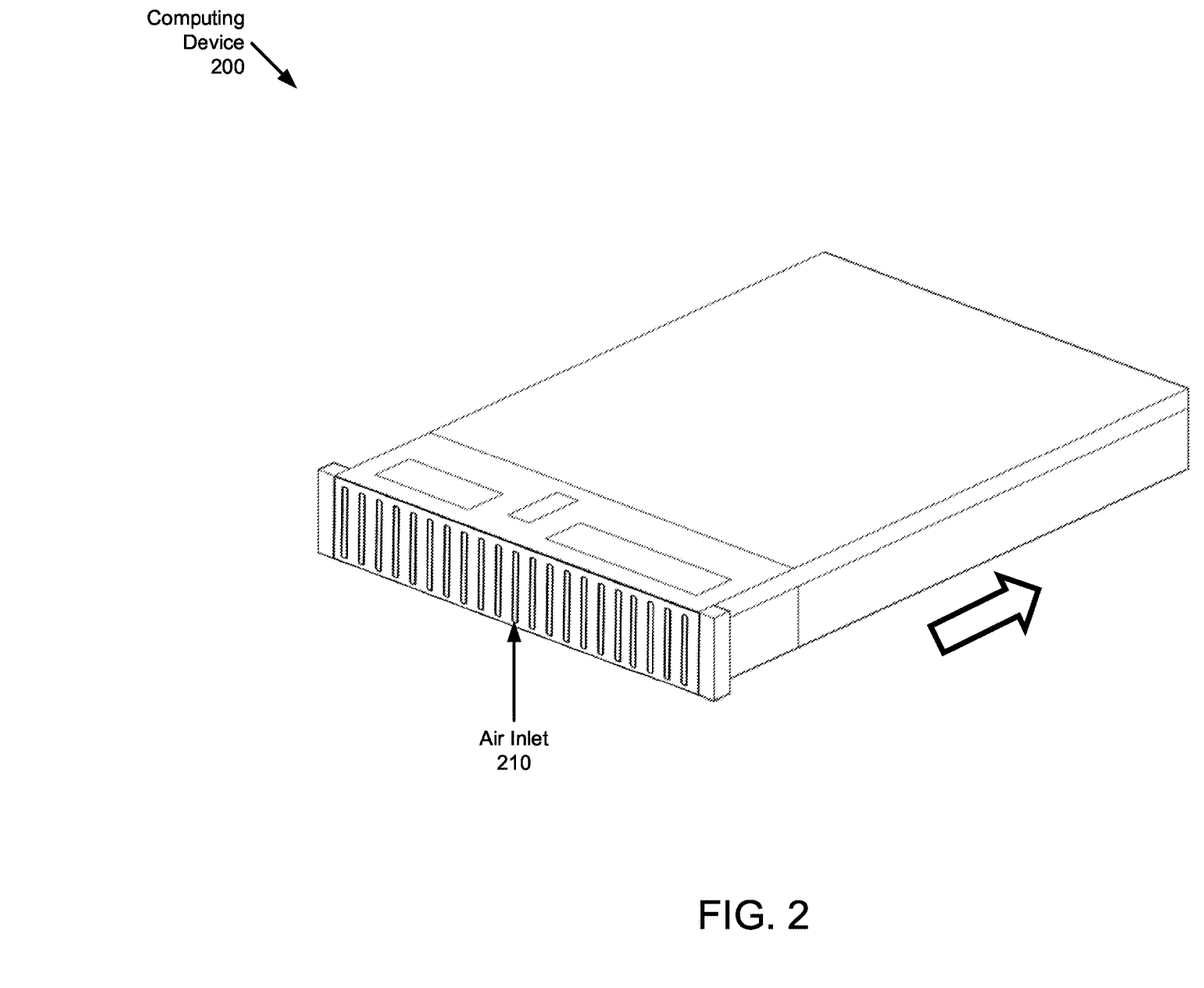
FIG. 2 shows a diagram of a computing device in accordance with one or more embodiments of the invention.

Turning now to FIG. 2, FIG. 2 shows a diagram of a computing device (200) in accordance with one or more embodiments of the invention. In one or more embodiments of the invention, the computing device includes six sides (i.e., top, bottom, right, left, front, and back), where air drawn into from the frontside of the computing device (i.e., air inlet (210)) and expelled from the backside of the computing device (airflow direction is shown with an arrow). In general, air incoming from the frontside of the computing device is cooler than air outgoing from the backside of the computing device.

To provide services, the computing device (200) may utilize computing device resources provided by a number of hardware components housed within the computing device. The number of hardware components may include, for example, persistent storage drives (not shown), non-persistent storage drives (not shown), processors (not shown), peripheral component interconnects (not shown), a printed circuit board (not shown), a number of printed circuit board components (not shown), and/or other types of physical components that contribute to the operation of the computing device (200). In other embodiments of the invention, one or more of the hardware components may be omitted or additional hardware components may be added based on the services provided by the computing device.

A passive and/or active environmental management of the information handling system may improve stability and functionality of the computing device operating in harsh environmental conditions. More specifically, the information handling system may include one or more passive and/or active environmental management components to regulate the internal environment of the information handling system.

FIGS. 3.1-3.4 show different embodiments to perform a passive environmental management of an information handling system using a passive component in accordance with one or more embodiments disclosed below.

Figure 31:
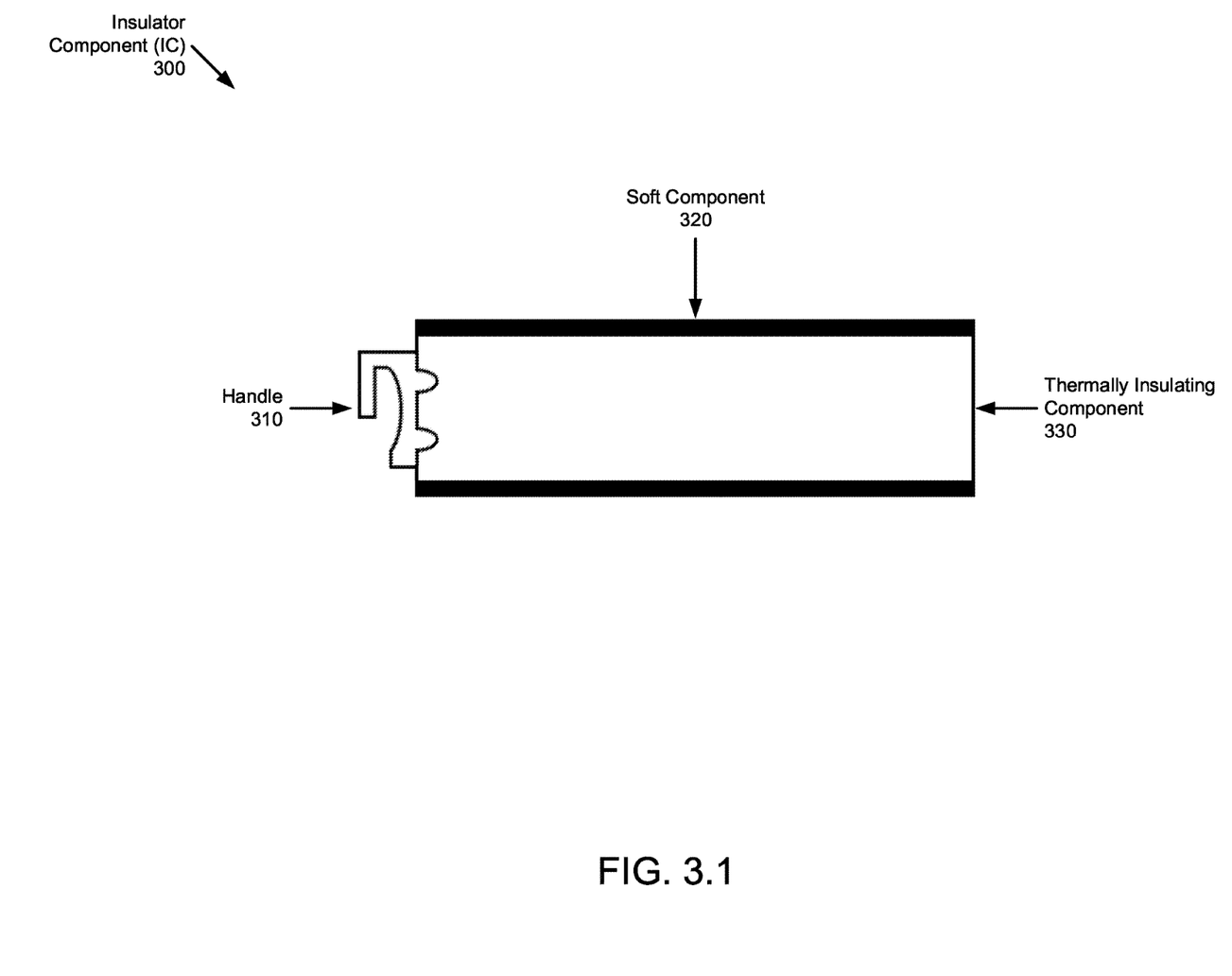

Turning now to FIG. 3.1, FIG. 3.1 shows a side-view of an insulator component (300) in accordance with one or more embodiments of the invention. In one or more embodiments of the invention, the side-view of the insulator component shows a handle (310), a number of soft components (e.g., 320), and a thermally insulating component (330). The handle (310) is affixed to the thermally insulating component (330) and it enables easy engagement and/or disengagement of the insulator component (300) from the cabinet (e.g., 110, FIG. 1). Further, one side of the number of soft components (e.g., 320) is affixed to the thermally insulating component (330).

In one or more embodiments of the invention, the thermally insulating component provides thermal insulation features such that it minimizes heat transfer outside the computing device (i.e., reduction of heat transfer due to conduction). In one or more embodiments of the invention, the thermally insulating component may be made of rigid foam, any type of thermal insulation material, and/or any combination thereof that enables the insulator component to perform the functions described herein.

In one or more embodiments of the invention, a soft component is a compliant material to make sure that there are no air gaps (or limited air gaps) between the thermally insulating component and one or more computing devices in the information handling system. In one or more embodiments of the invention, the soft component may be made of compressible foam, plastic, any type of soft material, and/or any combination thereof that enables the insulator component to perform the functions described herein.

In one or more embodiments of the invention, one side of the number soft components conforms to (i.e., is in contact with) the computing device. As a heater component (not shown) initiates heating of cold air within the internal environment of the information handling system, the insulator component (300) will act as a barrier to keep warmer air inside the computing device. With this way, the amount of heat dissipated by the computing device to the internal environment of the information handling system will be reduced.

Figure 32:
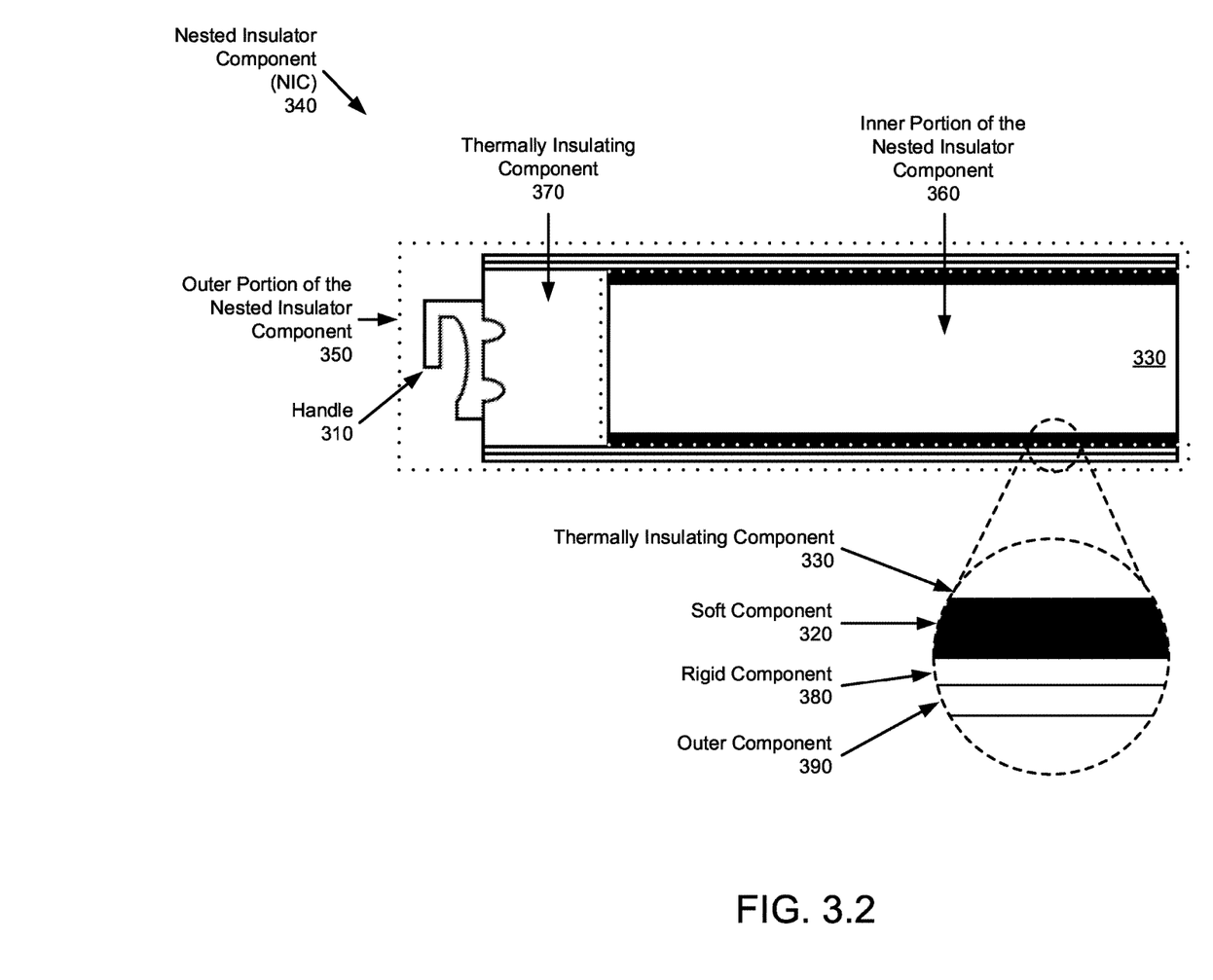

Turning now to FIG. 3.2, FIG. 3.2 shows a side-view of a nested insulator component (340) in accordance with one or more embodiments of the invention. In one or more embodiments of the invention, the side-view of the nested insulator component shows a handle (310), a number of soft components (e.g., 320), a number of thermally insulating components (e.g., 330, 370), a number of rigid components (e.g., 380), and a number of outer components (e.g., 390). In one or more embodiments of the invention, the nested insulator component includes an outer portion (350, shown with dotted lines) and an inner portion (360). The outer portion of the nested insulator component (350) includes the handle (310), a thermally insulating component (370), the number of rigid components (e.g., 380), and the number of outer components (e.g., 390). The inner portion of the nested insulator component (360) includes a thermally insulating component (330) and the number of soft components (e.g., 320). The outer portion of the nested insulator component enables the nested insulator component to be placed in any size of cabinet to perform the functions described herein.

In one or more embodiments of the invention, the combination of a rigid component and an outer component provide additional structural rigidity when the overall size of the nested insulator component is extended along the direction of the outward force. In one or more embodiments of the invention, the rigid component may be made of sheet metal, any other rigid material, and/or any combination thereof that enables the nested insulator component to perform the functions described herein. Further, in one or more embodiments of the invention, an outer component may be made of foam, plastic, any other material, and/or any combination thereof that enables the nested insulator component to perform the functions described herein.

In one or more embodiments of the invention, one side of the number of soft components (e.g., 320) conforms to the number of rigid components (e.g., 380). In one or more embodiments of the invention, one side of the number of soft components (e.g., 320) is affixed to the thermally insulating component (330). Further, the handle (310) is affixed to the thermally insulating component (370) and it enables easy engagement and/or disengagement of the nested insulator component (340) from the cabinet (e.g., 110, FIG. 1).

Figure 33:
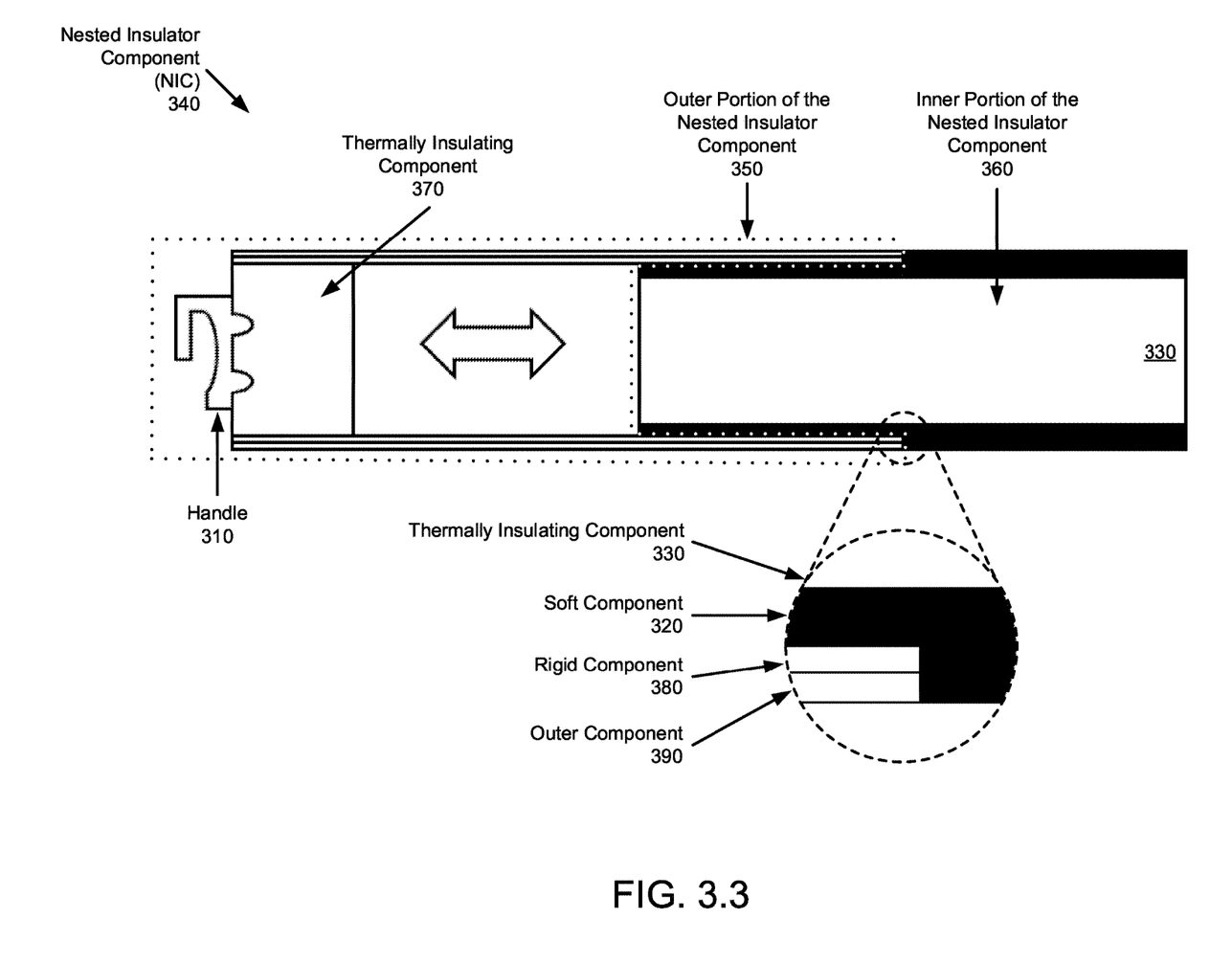

Turning now to FIG. 3.3, FIG. 3.3 shows a side-view of a nested insulator component (340) in accordance with one or more embodiments of the invention. In one or more embodiments of the invention, the side-view of the nested insulator component shows a handle (310), a number of soft components (e.g., 320), a number of thermally insulating components (e.g., 330, 370), a number of rigid components (e.g., 380), and a number of outer components (e.g., 390). In one or more embodiments of the invention, when an inward force is applied to the inner portion of the nested insulator component (360), the inner portion of the nested insulator component can move along a direction of the inward force relative to at least one of the number of rigid components. Further, when an outward force is applied to the inner portion of the nested insulator component (360), the inner portion of the nested insulator component can move along a direction of the outward force relative to at least one of the number of rigid components.

In an embodiment of the invention shown in FIG. 3.3, when the overall size of the nested insulator component is extended along the direction of the outward force, at least a portion of the number of soft components (e.g., 320) restores (or otherwise reverts) to its original shape. In this manner, one side of the number of soft components may continue to conform the computing device, and may fill the gap(s) between the nested insulator component and the computing device.

Those skilled in the art will appreciate that while one side of the number of soft components (e.g., 320) conforms to the rigid component (e.g., 380) and to the outer component (e.g., 390), remaining sides of the number of soft components (e.g., 320) may conform to another hardware component within the cabinet without departing from the invention.

Figure 34:
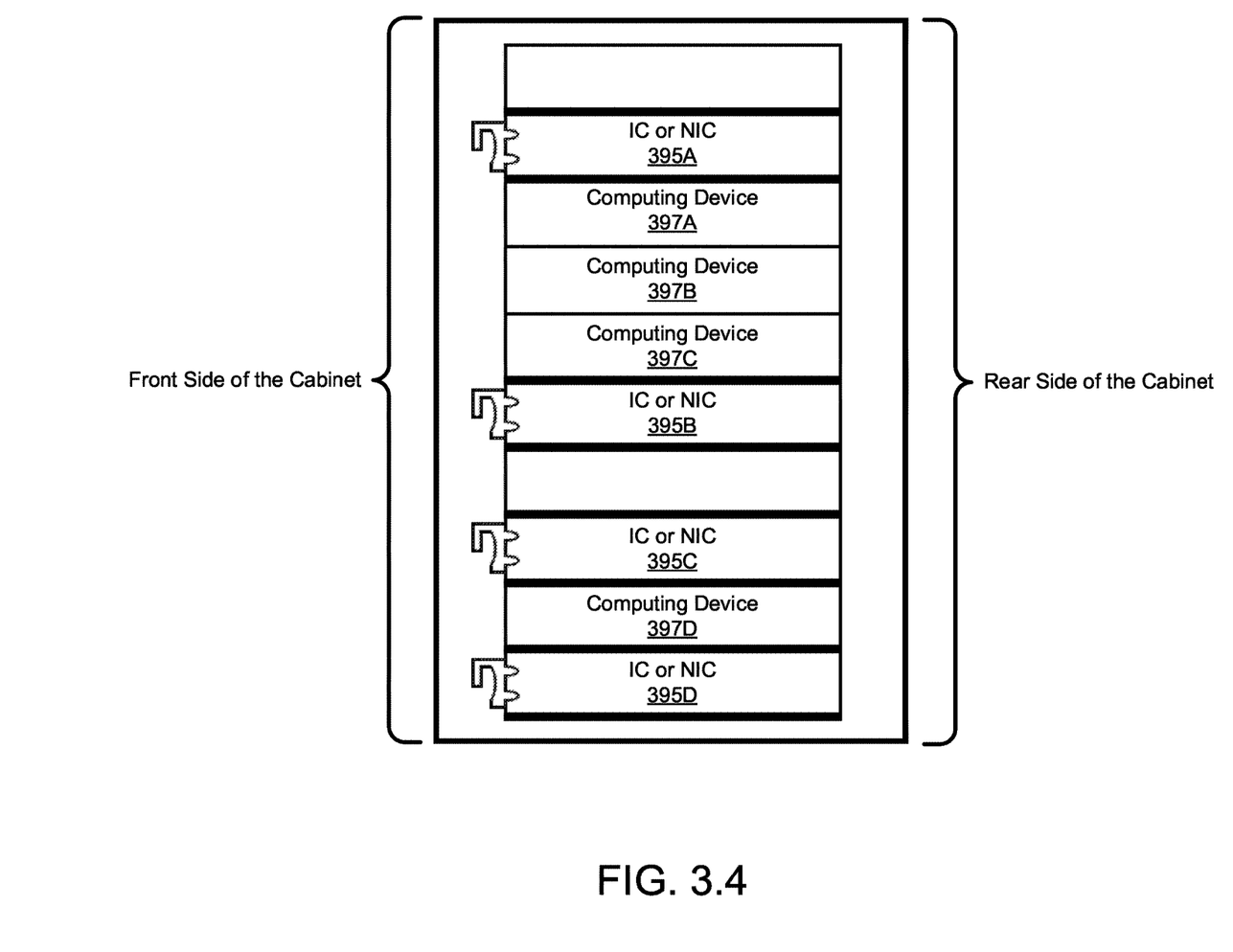

Turning now to FIG. 3.4, FIG. 3.4 shows a side-view of an information handling system in accordance with one or more embodiments of the invention. In one or more embodiments of the invention, the side-view of the information handling system shows a number of insulator components (ICs), a number of nested insulator components (NICs) (e.g., 395A) and a number of computing devices (e.g., 397A). In one or more embodiments of the invention, at least one side of the IC(s) or NIC(s) (e.g., 395A) conforms to at least one side of the computing device (e.g., 397A) without negatively impacting the operation of the computing device.

In one or more embodiments of the invention, locations of the number of ICs or NICs (e.g., 395A) and the number of computing devices (e.g., 397A) within the cabinet can be arranged in any configuration as needed. For example, in one embodiment of the invention, a user can combine the number of ICs with the number of computing devices to perform a passive environmental management of the information handling system (e.g., 100, FIG. 1). In another embodiment of the invention, the user can combine the number of NICs with the number of computing devices to perform a passive environmental management of the information handling system (e.g., 100, FIG. 1).

Figure 41:
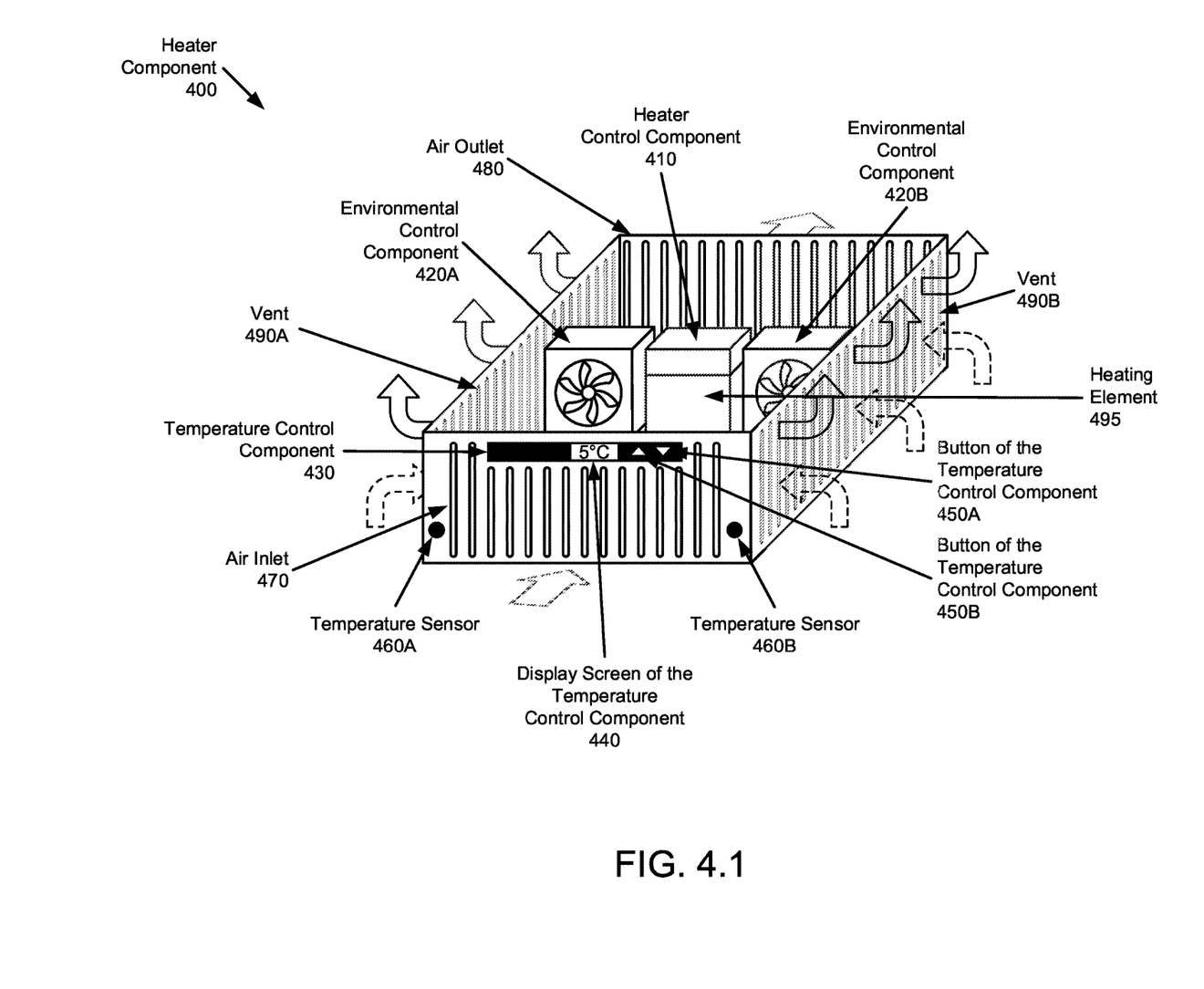
Figure 42:
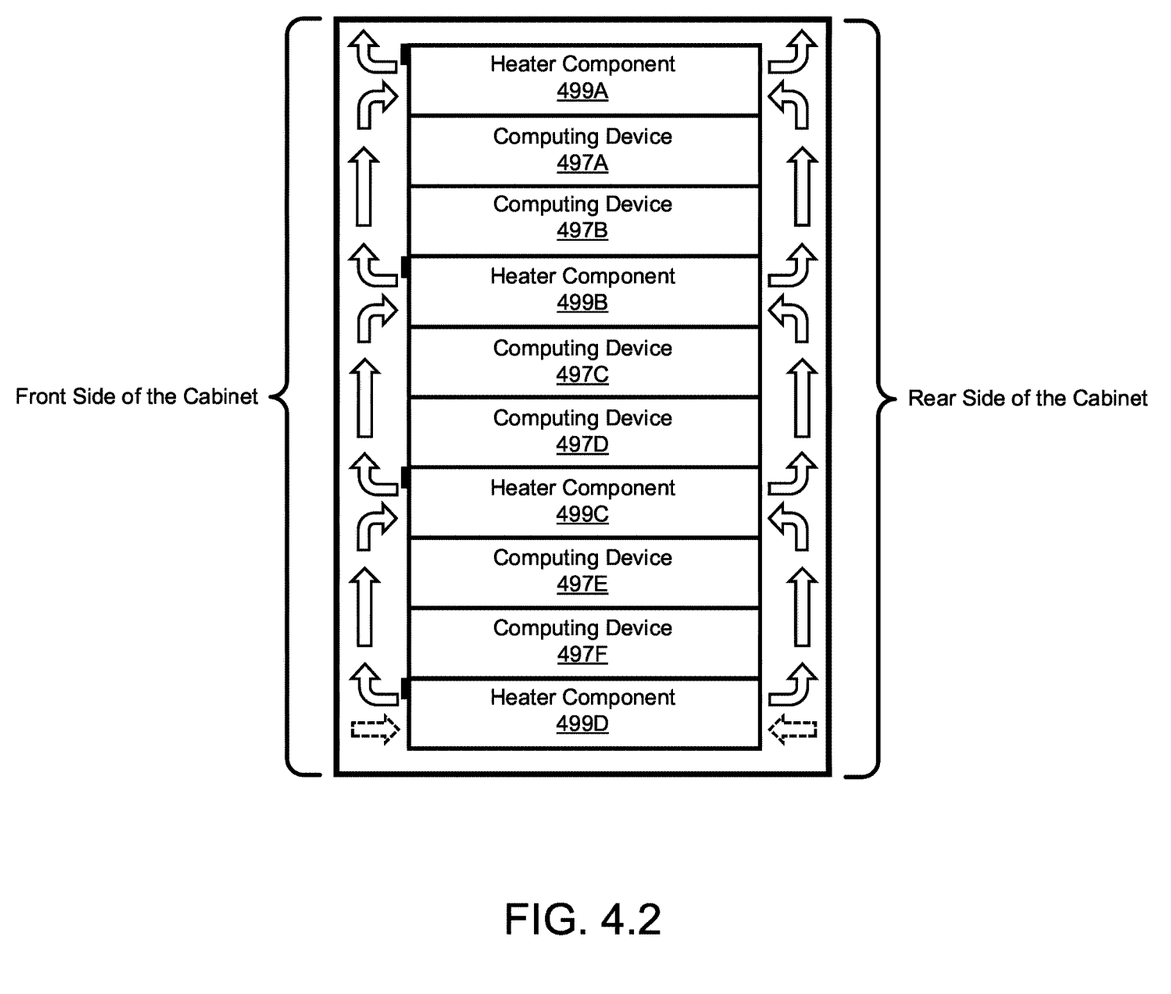

FIGS. 4.1 and 4.2 show different embodiments to perform active environmental management of an information handling system using a heater component in accordance with one or more embodiments disclosed below.

Turning now to FIG. 4.1, FIG. 4.1 shows a diagram of a heater component (400) in accordance with one or more embodiments of the invention. In one or more embodiments of the invention, the diagram of the heater component includes a heater control component (410), a number of environmental control components (e.g., 420A, 420B), a temperature control component (430), a display screen of the temperature control component (440), a number of buttons of the temperature control component (e.g., 450A, 450B), a number of temperature sensors (e.g., 460A, 460B), an air inlet (e.g., 470), an air outlet (e.g., 480), a number of vents (e.g., 490A, 490B), and a heating element (495). Additional detail about these components is provided below.

In one or more embodiments of the invention, the heater control component (410) may provide heating control services. The heating control services may include, but are not limited to, (i) obtaining information regarding the temperature of one or more computing devices within the cabinet (e.g., 110, FIG. 1), where the information may be obtained wirelessly or via the number of temperature sensors (e.g., 460A, 460B), (ii) determining an environmental condition of the information handling system, e.g., determining whether the temperature of one or more computing devices is below the appropriate operating temperature range (e.g., whether the temperature is below 0° C.) and/or determining whether the temperature of the internal environment of the information handling system is below the appropriate operating temperature range (e.g., whether the temperature is below 0° C.), (iii) initiating, based on (ii), a heating process to bring the temperature of one or more computing devices into its designed operating temperature, and/or (iv) preventing damage (e.g., thermal runaway) to the heating element in the event of overheating.

In one or more embodiments of the invention, when the heater control component (410) activates the heating element (495), cold air (shown with dash line arrows) maybe drawn into the heater component (400) through the air inlet (470) and/or the vents (e.g., 490A, 490B). The environmental control components (e.g., 420A, 420B) move cold air through the heating element (495) and cold air becomes warmer after passing through the heater element. In an embodiment of the invention shown in FIG. 4.1, the solid line arrows represent hot air expelled from the air outlet (e.g., 480) and the number of vents (e.g., 490A, 490B) to the internal environment of the information handling system. A two-way implementation (i.e., cold air intake and hot air emission) in the number of vents (e.g., 490A, 490B) of the heater component (400) facilitates better distribution of hot air to the internal environment of the information handling system.

In one or more embodiments of the invention, the heater component (400) heats adjacent computing devices by heat conduction (i.e., through at least one of its surfaces in contact with the adjacent computing devices) as well as heat convection. Further, in one or more embodiments of the invention, the number of computing devices may have its internal temperature sensors (not shown). With the help of these internal temperature sensors, the number of computing devices may wait until the heater component has warmed the air within the internal environment of the information handling system to a temperature high enough to operate.

In one or more embodiments of the invention, while illustrated as a physical structure, the heater control component (410) may be implemented as a logical entity (e.g., a program executing using the printed circuit board components (not shown) in the computing device (e.g., 497A, FIG. 4.2)). For example, the computing device (e.g., 497A, FIG. 4.2) may host a program that provides the functionality of the heater control component. Those skilled in the art will appreciate that the heater control component may be supplied with power, directly or indirectly, via one or more power supplies (not shown) within the heater component.

Continuing the discussion of FIG. 4.1, in one or more embodiments of the invention, the environmental control components (e.g., 420A, 420B) may include physical devices that provide functionality to alter characteristics (e.g., airflow directions, temperature of incoming and outgoing air, etc.) of the internal environment of the heater component at a macroscopic level. For example, the environmental control components (e.g., 420A, 420B) may include gas movers such as fans. The fans may be able to change a rate of gases drawn into and expelled from the heater component.

Those skilled in the art will appreciate that while the heater control component (410), the number of environmental control components (e.g., 420A, 420B), and the heating element (495) are shown that they are located in the middle of the heater component (400), those components may be placed at any location within and/or on the heater component without departing from the invention.

In one or more embodiments of the invention, the display screen of the temperature control component (440) may be a liquid crystal display (LCD), a plasma display, a touchscreen, or any other display device that enables the heater component to perform functions described herein. In an embodiment of the invention shown in FIG. 4.1, it shows the current temperature (e.g., 5° C.) of hot air expelled from the heater component to the internal environment of the information handling system. Further, the number of buttons of the temperature control component (e.g., 450A, 450B) enables setting the temperature to which cold air that is drawn into the heater component (400) is to be heated by the heating element.

Turning now to FIG. 4.2, FIG. 4.2 shows a side-view of an information handling system in accordance with one or more embodiments of the invention. In one or more embodiments of the invention, the side-view of the information handling system shows a number of computing devices (e.g., 497A) and a number of heater components (e.g., 499A). In one or more embodiments of the invention, locations of the number of computing devices (e.g., 497A) and the number of heater components (e.g., 499A) within the cabinet can be arranged in any configuration as needed. For example, in one embodiment of the invention, the user can combine the number of heater components with the number of computing devices to perform an active environmental management of the information handling system (e.g., 100, FIG. 1).

Further, in an embodiment of the invention shown in FIG. 4.2, the arrows show the airflow within the internal environment of the information handling system. The dash line arrows represent cold air circulating in the internal environment of the information handling system and the solid line arrows represent hot air circulating in the internal environment of the information handling system. As indicated, the hot air leaving the number of heater components (e.g., 499A) creates a layer of hot air surrounding the number of computing devices.

In one or more embodiments of the invention, each heater component can operate independently or in coordination with other heater components within the information handling system for better environmental management of the information handling system. In one or more embodiments of the invention, each heater component can be controlled locally (e.g., via a user) or remotely (e.g., wirelessly). In one embodiment of the invention, remote management of the heater component(s) may be performed using a computing device (which may or may not be in the information handling system), a mobile phone, a laptop, etc.

Figure 5:
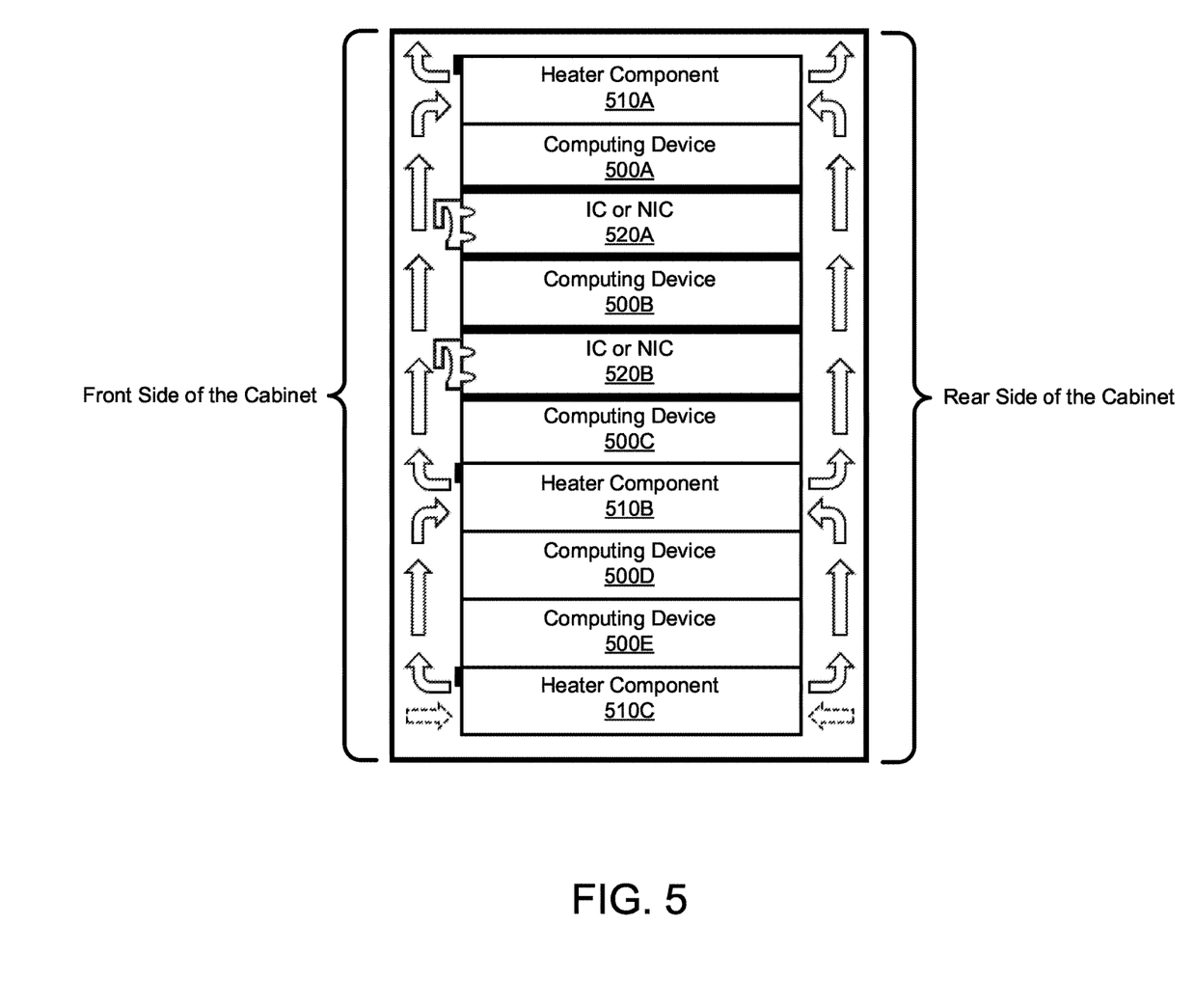
FIG. 5 shows a side-view of an information handling system in accordance with one or more embodiments of the invention.

FIG. 5 shows a passive and active environmental management of an information handling system in accordance with one or more embodiments disclosed below.

Turning now to FIG. 5, FIG. 5 shows a side-view of an information handling system in accordance with one or more embodiments of the invention. In one or more embodiments of the invention, the side-view of the information handling system shows a number of computing devices (e.g., 500A), a number of heater components (e.g., 510A), and a number of ICs or NICs (e.g., 520A). In one or more embodiments of the invention, at least one side of the number of ICs or NICs (e.g., 520A) conforms to (or substantially conforms) at least one side of the computing device (e.g., 500A) without negatively impacting the operation of the computing device. In one or more embodiments of the invention, locations of the number of computing devices (e.g., 500A), the number of heater components (e.g., 510A), and the number of ICs or NICs (e.g., 520A) within the cabinet can be arranged in any configuration as needed.

For example, in one embodiment of the invention, the user can combine the number of ICs and the number of heater components with the number of computing devices to perform a passive and active environmental management of the information handling system (e.g., 100, FIG. 1). In another embodiment of the invention, the user can combine the number of NICs and the number of heater components with the number of computing devices to perform a passive and active environmental management of the information handling system (e.g., 100, FIG. 1). In both embodiments of the invention, the addition of ICs or NICs to the number of heater components may increase the efficiency of the number of heater components such that the number of computing devices may heat up faster.

Continuing the discussion of FIG. 5, in an embodiment of the invention shown in FIG. 5, the arrows show the airflow within the internal environment of the information handling system. The dash line arrows represent cold air circulating in the internal environment of the information handling system and the solid line arrows represent hot air circulating in the internal environment of the information handling system. As indicated, the hot air leaving the number of heater components (e.g., 510A) creates a layer of hot air surrounding the number of computing devices.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An information handling system, comprising:
    a plurality of computing devices; and
    a plurality of environmental management units (EMUs) external to the plurality of computing devices and configured to manage an internal environment of the information handling system, wherein a first EMU of the plurality of EMUs comprises an insulator component, wherein the insulator component comprises a soft component, wherein the soft component conforms to at least one side of one of the plurality of computing devices.

2. The information handling system of claim 1, wherein managing the internal environment of the information handling system comprises maintaining a temperature of the internal environment of the information handling system within an operating range of the plurality of computing devices.

3. The information handling system of claim 1, wherein managing the internal environment of the information handling system comprises raising a temperature of the internal environment of the information handling system to be within an operating range of the plurality of computing devices.

4. The information handling system of claim 1, wherein the insulator component further comprises:
    a handle; and
    a thermally insulating component, wherein the soft component is affixed to the thermally insulating component.

5. The information handling system of claim 1, wherein a second EMU of the plurality of EMUs comprises a nested insulator component.

6. The information handling system of claim 5, wherein the nested insulator component comprises:
    a handle;
    a plurality of thermally insulating components;
    a second soft component, wherein the second soft component conforms to the at least one side of one of the plurality of computing devices; and
    at least one rigid component, wherein the at least one rigid component conforms to the second soft component.

7. The information handling system of claim 6, wherein when an inward force is applied to an inner portion of the nested insulator component, the inner portion of the nested insulator component moves along a direction of the inward force relative to at least one rigid component.

8. The information handling system of claim 6, wherein when an outward force is applied to an inner portion of the nested insulator component, the inner portion of the nested insulator component moves along a direction of the outward force relative to at least one rigid component.

9. The information handling system of claim 6, wherein the nested insulator component further comprises at least one outer component, wherein the at least one rigid component is affixed to the at least one outer component.

10. The information handling system of claim 1, wherein a third EMU of the plurality of EMUs comprises a heater component.

11. The information handling system of claim 10, wherein the heater component is configured to manage heating of the information handling system using a heater control component.

12. The information handling system of claim 11, wherein the heater component further comprises:
    an air inlet;
    an air outlet;
    a plurality of vents;
    a heating element; and
    a temperature control component, wherein the temperature control component comprises a display screen and a plurality of buttons, wherein the plurality of buttons enables a user to set a temperature to which air is heated by the heating element.

13. The information handling system of claim 12, wherein the heating element is configured to heat cold air drawn into an internal environment of a heater component via the air inlet or at least one of the plurality of vents.

14. The information handling system of claim 12, wherein the air outlet or at least one of the plurality of vents is configured to expel warmer air to an external environment of a heater component.

15. The information handling system of claim 1, wherein the information handling system comprises the first EMU of the plurality of EMUs and a second EMU of the plurality of EMUs, wherein the second EMU of the plurality of EMUs is a heater component.

16. The information handling system of claim 1, wherein the first EMU of the plurality of EMUs has the same form factor as at least one of the plurality of computing devices.

17. A method for heating an internal environment of an information handling system, comprising:
   determining an environmental condition of the information handling system; and
   in response to the determination, initiating heating of cold air circulating within the internal environment of the information handling system using an environmental management unit (EMU), wherein the EMU is located within the information handling system and is external to a plurality of computing devices,
   wherein the information handing system further comprises an insulator component, wherein the insulator component comprises a soft component, wherein the soft component conforms to at least one side of one of the plurality of computing devices, wherein the insulator component is configured to manage the internal environment of the information handling system.

18. The method of claim 17,
   wherein the EMU comprises a heater component,
   wherein the heater component is configured to manage heating of the internal environment of the information handling system using a heater control component.

* * * * *